(12) United States Patent
Levinson et al.

(10) Patent No.: US 7,985,513 B2
(45) Date of Patent: Jul. 26, 2011

(54) FLUORINE-PASSIVATED RETICLES FOR USE IN LITHOGRAPHY AND METHODS FOR FABRICATING THE SAME

(75) Inventors: Harry J. Levinson, Saratoga, CA (US); Uzodinma Okoroanyanwu, Northampton, MA (US); Anna Tchikoulaeva, Dresden (DE); Rene Wirtz, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 214 days.

(21) Appl. No.: 12/050,383

(22) Filed: Mar. 18, 2008

(65) Prior Publication Data

US 2009/0239155 A1 Sep. 24, 2009

(51) Int. Cl.
*G03F 1/00* (2006.01)
(52) U.S. Cl. .............................. 430/5; 430/311; 430/394
(58) Field of Classification Search .............. 430/5, 311, 430/67; 438/681
See application file for complete search history.

(56) References Cited

U.S. PATENT DOCUMENTS

| | | | |
|---|---|---|---|
| 5,738,959 A * | 4/1998 | Miyashita et al. | 430/5 |
| 6,214,730 B1 * | 4/2001 | Cooney et al. | 438/681 |
| 6,544,894 B1 * | 4/2003 | Kobayashi | 430/5 |
| 2003/0203289 A1 * | 10/2003 | Yan et al. | 430/5 |
| 2004/0055874 A1 * | 3/2004 | Hiraiwa et al. | 204/250 |
| 2004/0072081 A1 * | 4/2004 | Coleman et al. | 430/5 |
| 2004/0131948 A1 * | 7/2004 | Yan | 430/5 |
| 2006/0269770 A1 * | 11/2006 | Cox et al. | 428/553 |
| 2007/0248894 A1 * | 10/2007 | Endo et al. | 430/5 |

* cited by examiner

*Primary Examiner* — Mark F Huff
*Assistant Examiner* — Rashid Alam
(74) *Attorney, Agent, or Firm* — Ingrassia Fisher & Lorenz, P.C.

(57) ABSTRACT

Fluorine-passivated reticles for use in lithography and methods for fabricating and using such reticles are provided. According to one embodiment, a method for performing photolithography comprises placing a fluorine-passivated reticle between an illumination source and a target semiconductor wafer and causing electromagnetic radiation to pass from the illumination source through the fluorine-passivated reticle to the target semiconductor wafer. In another embodiment, a fluorine-passivated reticle comprises a substrate and a patterned fluorine-passivated absorber material layer overlying the substrate. According to another embodiment, a method for fabricating a reticle for use in photolithography comprises providing a substrate and forming a fluorine-passivated absorber material layer overlying the substrate.

12 Claims, 3 Drawing Sheets

FIG. 1

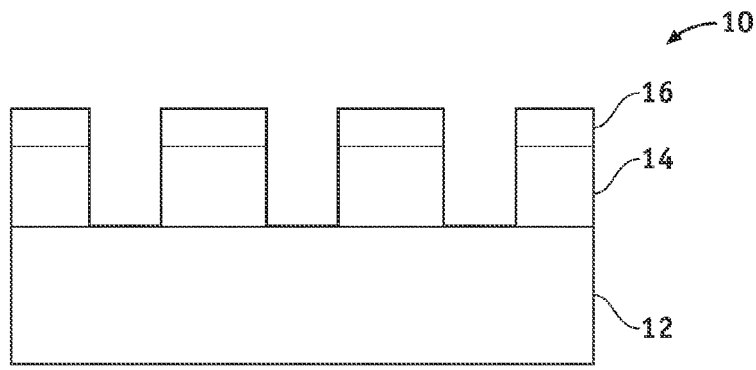
FIG. 1
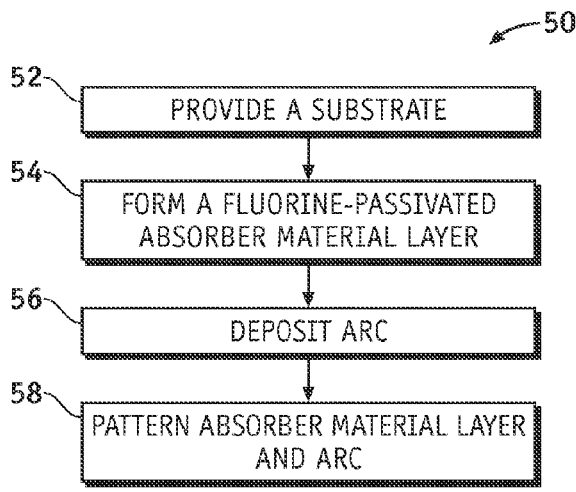
FIG. 2
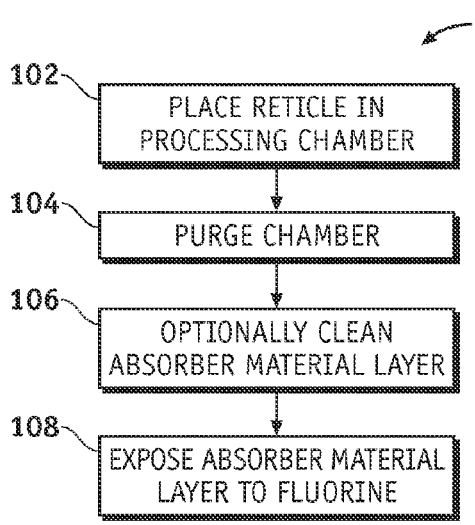
FIG. 3
FIG. 4

FLUORINE-PASSIVATED RETICLES FOR USE IN LITHOGRAPHY AND METHODS FOR FABRICATING THE SAME

FIELD OF THE INVENTION

The present invention generally relates to reticles for photolithography and methods for fabricating photolithography reticles, and more particularly relates to fluorine-passivated reticles for photolithography and methods for fabricating such reticles.

BACKGROUND OF THE INVENTION

The semiconductor or integrated circuit (IC) industry aims to manufacture ICs with higher and higher densities of devices on a smaller chip area to achieve greater functionality and to reduce manufacturing costs. This desire for large scale integration has led to a continued shrinking of circuit dimensions and device features. The ability to reduce the size of structures, such as gate lengths in field-effect transistors and the width of conductive lines, is driven by lithographic performance.

With conventional lithography systems, radiation is provided through or reflected off a photomask or reticle to form an image on a semiconductor wafer. In the field of integrated circuits, a reticle can be classified as a plate that contains the pattern for one or more die but is not large enough to transfer a wafer-sized pattern all at once. A mask can be classified as a plate that contains a pattern large enough to pattern a whole wafer at a time. For the sake of brevity, the term "reticle" will be used herein to include both reticles and masks as defined above, as the various embodiments of the present invention apply to both. A reticle typically comprises a transparent substrate upon which is disposed an absorber material that typically comprises chromium but, alternatively, may comprise molybdenum and silicon, or other materials. The absorber material is covered by an antireflective coating (ARC) that typically comprises chromium oxide. Both the absorber material and the overlying ARC are patterned so that, during photolithography, a desired image is projected through the reticle onto the semiconductor wafer. Generally, the image is focused on the wafer to expose and pattern a layer of material, such as photoresist material. In turn, the photoresist material is utilized to define doping regions, deposition regions, etching regions, or other structures associated with ICs in one or more layers of the semiconductor wafer. The photoresist material can also define conductive lines or conductive pads associated with metal layers of an IC. Further, the photoresist material can define isolation regions, transistor gates, or other transistor structures and elements.

Older lithography systems are typically configured to expose the photoresist material at a radiation, conventionally produced by krypton fluoride (KrF) excimer lasers, having a wavelength of 248 nanometers (nm). However, because the resolution limit of features is, in part, dependent upon the exposure wavelength, it is desirable to pattern photoresist material using radiation at shorter exposure wavelengths (e.g., the wavelength range bounded approximately by, and including, 193 nm to 13.4 nm (193 nm, 157 nm, 126 nm, or 13.4 nm)). Unfortunately, reticles subjected to these shorter wavelengths may exhibit migration of material from the absorber material and/or the ARC to cover otherwise exposed areas of the transparent substrate. For example, over continued use, reticles with absorber materials that comprise chromium have been found to exhibit migration or spreading of material resulting in chromium and chromium oxide residue on the substrate about the mask features. Such a phenomenon also may be likely with other absorber materials. For example, because molybdenum and chromium have similar metallic structures, it may be expected that absorber material layers of molybdenum silicide will exhibit molybdenum and/or molybdenum oxide migration. The migrated material distorts the dimensions of the features of the mask, thus degrading the quality of the mask. While the migrated material may be removed from the mask by methods such as etching, this cleaning process increases costs of the photolithography process and results in down time unless an alternate reticle is available, which also increases costs of the process.

Accordingly, it is desirable to provide reticles for use in photolithography that do not exhibit material migration during exposure to ultraviolet radiation. It also is desirable to provide methods for fabricating reticles for use in photolithography that do not exhibit material migration during exposure to ultraviolet radiation. Furthermore, other desirable features and characteristics of the present invention will become apparent from the subsequent detailed description of the invention and the appended claims, taken in conjunction with the accompanying drawings and this background of the invention

BRIEF SUMMARY OF THE INVENTION

A method for performing photolithography is provided in accordance with an exemplary embodiment of the present invention. The method comprises placing a fluorine-passivated reticle between an illumination source and a target semiconductor wafer and causing electromagnetic radiation to pass from the illumination source through the fluorine-passivated reticle to the target semiconductor wafer.

A fluorine-passivated reticle for use in photolithography is provided in accordance with an exemplary embodiment of the invention. The fluorine-passivated reticle comprises a substrate and a patterned fluorine-passivated absorber material layer overlying the substrate.

A method for fabricating a reticle for use in photolithography is provided in accordance with an exemplary embodiment of the present invention. The method comprises providing a substrate and forming a fluorine-passivated absorber material layer overlying the substrate.

BRIEF DESCRIPTION OF THE DRAWINGS

The present invention will hereinafter be described in conjunction with the following drawing figures, wherein like numerals denote like elements, and wherein:

FIG. 1 is a cross-sectional view of a fluorine-passivated reticle for use in photolithography, in accordance with an exemplary embodiment of the present invention;

FIG. 2 is a flowchart of a method for fabricating a fluorine-passivated reticle for use in photolithography, in accordance with an exemplary embodiment of the present invention;

FIG. 3 is a flowchart of a method for forming a fluorine-passivated absorber material layer of a fluorine-passivated reticle for use in photolithography, in accordance with an exemplary embodiment of the present invention;

FIG. 4 is a flowchart of a method for fluorinating an absorber material layer using a direct fluorination process, in accordance with an exemplary embodiment of the present invention;

DETAILED DESCRIPTION OF THE INVENTION

Figure 5:
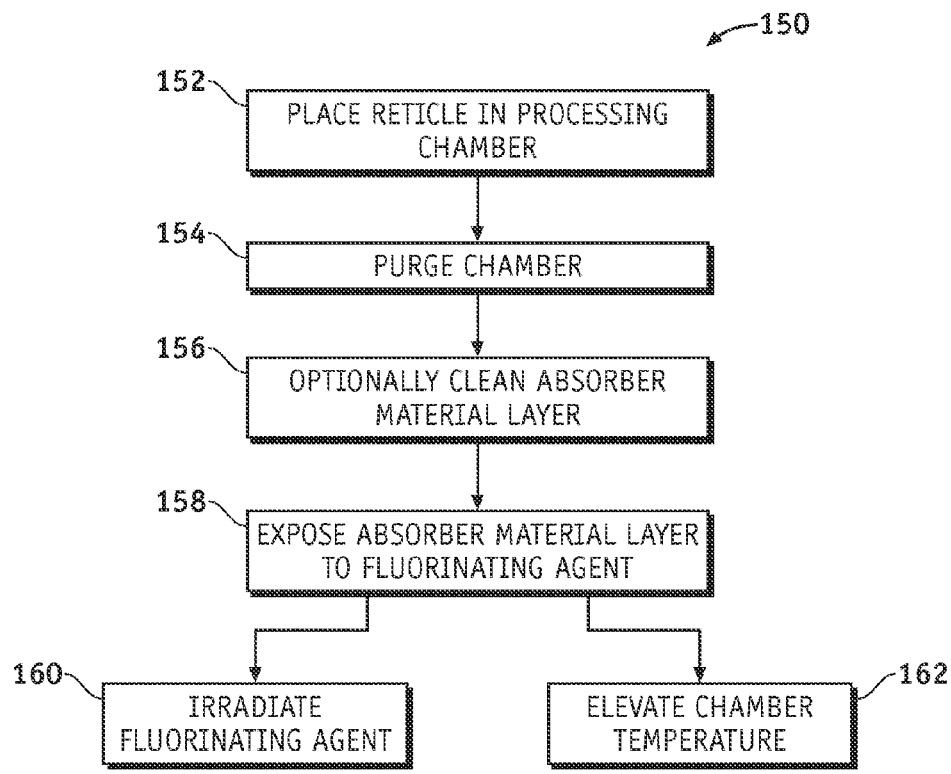
FIG. 5 is a flowchart of a method for fluorinating an absorber material layer using a photochemical or thermal fluorination process, in accordance with another exemplary embodiment of the present invention.

The following detailed description of the invention is merely exemplary in nature and is not intended to limit the invention or the application and uses of the invention. Furthermore, there is no intention to be bound by any theory presented in the preceding background of the invention or the following detailed description of the invention.

FIG. 1 is a cross-sectional view of a fluorine-passivated reticle 10 for use in photolithography, in accordance with an exemplary embodiment of the present invention. Reticle 10 may have a variety of sizes and shapes, including, but not limited to round, rectangular or square. Reticle 10 also may be any variety of reticle types, including, but not limited to, a one-time master, a five-inch reticle, a six-inch reticle, a nine-inch reticle, or any other appropriately sized reticle that may be used to project an image of a circuit pattern onto a semiconductor wafer. Reticle 10 further may be a binary mask, a phase shift mask (PSM), an optical proximity correction (OPC) mask, or any other type of mask suitable for use in a lithography system.

Reticle 10 includes a patterned, fluorine-passivated absorber material layer 14 formed overlying a transparent substrate 12 that, when exposed to ultraviolet radiation in a lithography system, projects a pattern onto a surface of a semiconductor wafer (not shown). In one exemplary embodiment, reticle 10 further comprises an antireflective coating (ARC) 16 that is disposed on the patterned fluorine-passivated absorber material layer 14. Patterned fluorine-passivated absorber material layer 14 comprises a fluorine- and metal-comprising material that absorbs electromagnetic energy with short wavelengths, that is, in the ultraviolet (UV) range, the deep ultraviolet (DUV) range, vacuum ultraviolet (VUV) range, and the extreme ultraviolet range (EUV). Patterned, fluorine-passivated absorber material layer 14 is formed of any suitable metal-comprising material with a fluorinated surface or, alternatively, is formed from fluorinated materials. By passivating the absorber material layer with fluorine atoms, physical and thermal stability is imparted to the absorber material layer, thus minimizing material migration from the absorber material layer when subjected to short wavelength radiation. In addition, fluorine does not adversely affect the optical properties of the absorber material layer or of the transparent substrate. Moreover, fluorination of the absorber material, in accordance with the various embodiments disclosed herein, does not increase the dimensions of the absorber material and, thus maintains the originally-intended dimensions of the mask.

A method 50 for fabricating a fluorine-passivated reticle for use in photolithography, such as reticle 10 of FIG. 1, is illustrated in FIG. 2. The method 50 begins by providing a transparent substrate, such as transparent substrate 12 of FIG. 1 (step 52). In one exemplary embodiment, the substrate is a transparent material such as quartz, synthetic quartz, fused silica, magnesium fluoride, calcium fluoride, or any other suitable material that transmits at least seventy-five percent (75%) of incident radiation having a wavelength in the range of from about 10 nm to about 450 nm. In an alternative embodiment, the substrate may be a reflective material such as silicon or other suitable material that reflects greater than approximately fifty percent (50%) of incident radiation having a wavelength in the range of about 10 nm to about 450 nm. The substrate may have a variety of sizes and shapes, including, but not limited to round, rectangular or square.

The method 50 continues with the formation of a fluorine-passivated absorber material layer, such as fluorine-passivated absorber material layer 14 of FIG. 1, overlying the substrate (step 54). In one exemplary embodiment, as illustrated in FIG. 3, a method 70 for forming a fluorine-passivated absorber material layer comprises depositing an absorber material layer overlying the substrate (step 72) and then fluorinating the surface of the deposited absorber material layer (step 74). As noted above, the absorber material layer 14 comprises a fluorine-comprising and metal-comprising material. The metal-comprising material may comprise chrome, chromium nitride, a metallic oxy-carbo-nitride (M-O—C—N), where the metal M is chromium, cobalt, iron, zinc, molybdenum, niobium, tantalum, titanium, tungsten, aluminum, magnesium and silicon, or any other suitable material. In an alternative embodiment, absorber material layer 14 may be a partially transmissive material. An example of such a partially transmissive material includes molybdenum silicide, which has a transmissivity of approximately one percent (1%) to approximately thirty percent (30%) in the UV, DUV, VUV, and EUV ranges. The absorber material may be formed overlying the substrate by techniques such as evaporation, sputtering, spinning, or any other conventional technique used to form an absorber layer on a transparent substrate or an another absorber layer. The absorber material layer 14 may be deposited to a thickness in the range of from about 50 nm to about 150 nm.

The absorber material layer may be fluorinated, for example, by direct fluorination, photochemical or thermal decomposition of fluorine-comprising materials, or by electrochemical fluorination. A method 100 for passivating the absorber material layer using direct fluorination is illustrated in FIG. 4. The method begins by placing a reticle with an absorber material layer disposed overlying a substrate in a processing chamber of, for example, a chemical vapor deposition (CVD) reactor or other suitable reactor (step 102). The processing chamber preferably is made of a material that is not susceptible to fluorine etching, such as, for example, stainless steel or Teflon® fluoropolymer resin, available from DuPont of Wilmington, Del. The chamber is purged to remove the air therein so that the chamber is at vacuum pressure (step 104). In an optional embodiment, the surface of the absorber material layer is cleaned to remove any organic materials thereon (step 106). In this regard, the absorber material layer can be cleaned photochemically by introducing oxygen into the chamber and decomposing the oxygen using ultraviolet radiation, such as, for example, at a wavelength of about 172 nm, to produce oxygen species that oxidize and volatilize the hydrocarbons thereby removing them from the surface as carbon dioxide and hydrogen. The absorber material layer is cleaned for a time sufficient to remove at least substantially all the organic contaminants but not so long that corrosion of the absorber material layer results. The carbon dioxide, hydrogen, and oxygen then are evacuated from the chamber and the absorber material layer is exposed to fluorine by introducing fluorine gas into the chamber (step 108). The fluorine may be introduced into the chamber at relatively low pressures, such as, for example, 1 milliTorr to hundreds of Torr. The chamber may be heated to facilitate fluorination of the absorber material layer. The absorber material is exposed to the fluorine gas for a time sufficient to fluorinate substantially all the exposed surface of the absorber material.

As noted above, another method for passivating the absorber material by fluorinating its surface is photochemical or thermal fluorination. A method 150 for photochemically or thermally fluorinating the absorber material layer is illustrated in FIG. 5. The method 150 begins by placing a reticle comprising an absorber material layer disposed overlying a substrate in a processing chamber of, for example, a CVD reactor (step 152). The chamber is purged to remove the air therein so that the chamber is at reduced pressure (step 154). In an optional embodiment, the surface of the absorber material layer is cleaned to remove any organic materials on the surface (step 156). The absorber material layer can be cleaned, for example, by the method described above with reference to step 106 of FIG. 4. After the chamber is purged, the absorber material layer is exposed to fluorine by introducing at least one gaseous fluorinating agent into the chamber (step 158). The fluorinating agent can comprise any suitable fluorine-comprising compound that can be decomposed photochemically or thermally to form reactive fluorine atoms. Examples of fluorinating agents suitable for photochemical or thermal fluorination include graphite fluoride, hydrogen fluoride, fluoro-alkyl halogens such as fluoro-alkyl iodide and fluoro-alkyl bromide, compounds having hexafluoroacetone moieties, and combinations thereof. In one embodiment of the invention in which photochemical fluorination is to be performed, before and/or during exposure of the absorber material layer to the fluorinating agent, the fluorinating agent is irradiated with ultraviolet light, producing fluorine ions (step 160). The fluorine ions react with the surface of the absorber material layer, thereby passivating it. Preferably, the ultraviolet light has wavelengths in the deep UV region, that is, no greater than about 248 nm. (Fluorination is increasingly facilitated as the wavelengths of the radiation become shorter.) The chamber may be heated to facilitate fluorination of the absorber material layer. The flow rate of the fluorinating agent, the time of the exposure, and the wavelength of the UV radiation depend, at least in part, on the fluorinating agent used. It will be appreciated that the actual exposure time will depend upon the particular fluorinating agent used and the particular absorber material disposed on the substrate. The exposure time and other operating variables such as fluorinating agent flow rate, chamber temperature, wavelength of the UV radiation, etc., are interrelated and the optimum exposure time to be employed is determined to some extent by these other operating variables.

In an alternative embodiment of the invention in which thermal fluorination is to be performed, before and/or during exposure of the absorber material layer to the fluorinating agent, the temperature of the reaction chamber is elevated to a temperature sufficient to heat the fluorinating agent and form fluorine ions therefrom (step 162). The fluorine ions react with the surface of the absorber material layer, thereby passivating it. Similar to photochemical fluorination process, the flow rate of the fluorinating agent, the time of the exposure, and the temperature of the reaction chamber depend, at least in part, on the fluorinating agent used and the absorber material disposed on the substrate. In both the photochemical fluorination process and the thermal fluorination process, the absorber material is exposed to the fluorinating agent for time sufficient to fluorinate substantially all the exposed surface of the absorber material.

It will be appreciated that the fluorinating agent may be applied to the absorber material layer as a liquid instead of, or in addition, to exposure of the layer to a gaseous fluorinating agent. In this regard, the fluorinating agent can be applied to the absorber material layer by any suitable method, such as, spraying, rolling, or painting the agent onto the absorber material layer or dipping the absorber material layer in the fluorinating agent. The reticle then is placed into the reaction chamber and the photochemical or thermal fluorination process continues as described above.

Figure 6:
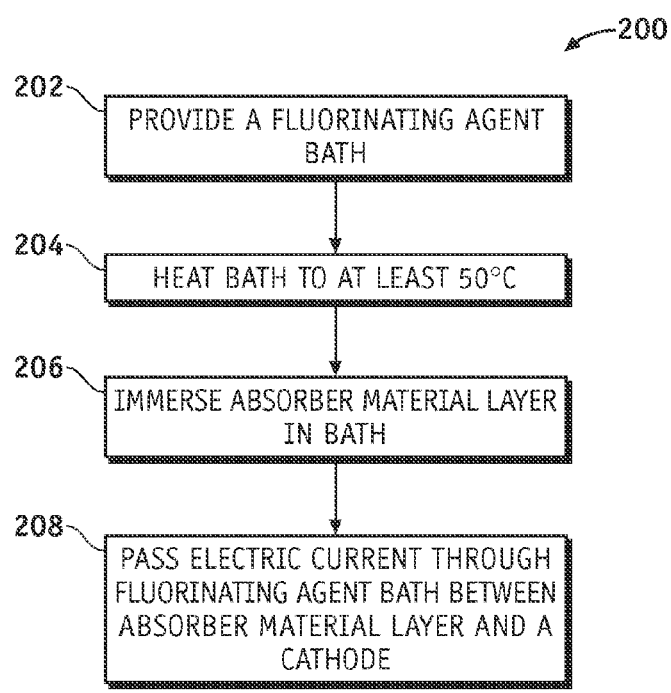
FIG. 6 is a flowchart of a method for fluorinating an absorber material layer using an electrochemical fluorination process, in accordance with yet another exemplary embodiment of the present invention.

As noted above, the absorber material layer alternatively may be passivated using electrochemical fluorination. A method 200 for electrochemically fluorinating an absorber material layer in accordance with another exemplary embodiment of the present invention is illustrated in FIG. 6. The method 200 includes the step of providing an electrolyte bath of at least one fluorinating agent (step 202). The fluorinating agent comprises any suitable fluorine complex that disassociates when subjected to an electric current. Examples of fluorinating agents suitable for use in the electrochemical fluorination process include anhydrous hydrogen fluoride solutions, triethylamine-hydrogen fluoride complexes (i.e., triethylamine.n(HF) complexes, where n ranges from 1 to 10) such as, for example, pyridine.hydrogen fluoride complex, cesium fluoride-ammonium fluoride-hydrogen fluoride complex (CsF—NH4F-4HF), and combinations thereof. The bath may comprise only the fluorinating agent or may comprise other additives and solvents, such as, for example, acetonitride, that facilitate electrochemical fluorination by modifying physical or chemical properties of the bath such as pH, viscosity, and the like. The bath is heated to a temperature in the range of at least 50° C. (step 204). Before, during, and/or after the bath is heated, the absorber material layer is configured as an anode and is immersed in the electrochemical bath (step 206). An electric current is passed through the bath between the absorber material layer anode and an oppositely charged element, which may be either another electrode immersed in the bath or a part of the cell body housing the bath that, in either case, can serve as the cathode (step 208). As the current passes through the fluorinating agent, the agent decomposes, releasing fluorine atoms that subsequently react with the absorber material layer, thereby passivating its surface. It will be appreciated that the actual residence time or contact time of the absorber in the bath during the electrochemical procedure will depend upon the particular fluorinating agent used and the particular absorber material disposed on the substrate. The residence time or contact time and other operating variable such as current density, bath temperature, other solvents and additives used, etc., are interrelated and the optimum residence time to be employed is determined to some extent by these other operating variables.

Figure 7:
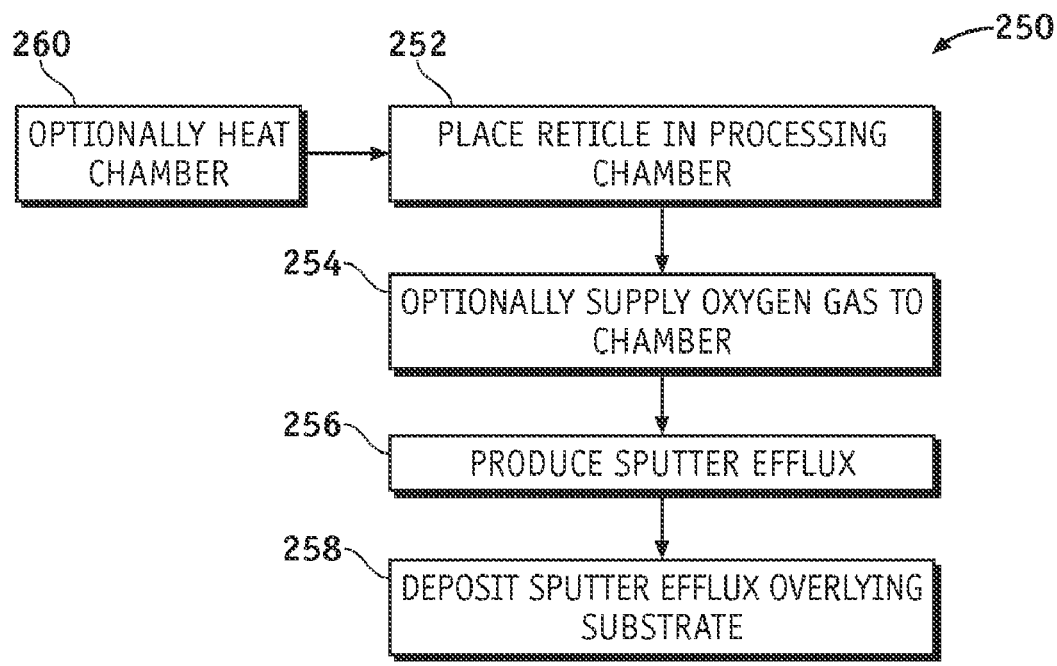
FIG. 7 is a flowchart of a method for forming a fluorine-passivated absorber material layer of a fluorine-passivated reticle for use in photolithography, in accordance with a further exemplary embodiment of the present invention.

Referring back to FIG. 2, in another exemplary embodiment of the invention, the step of forming a fluorinated absorber material layer (step 54) comprises forming the absorber material layer with pre-fluorinated components. In this manner, fluorine atoms will be disposed within the absorber material layer rather than just substantially at the surface of the layer. A method 250 for forming a fluorinated absorber material layer using pre-fluorinated components is illustrated in FIG. 7. The method begins by placing a substrate, such as substrate 12 disclosed above with reference to FIG. 1, in a processing chamber of a deposition system, such as, for example, an ion beam sputter deposition system, a plasma sputter deposition system, a CVD system, or the like (step 252). For illustration purposes, method 250 will be described with reference to an ion beam sputter deposition; however, it will be understood that the method can be used, with minor modification, in a plasma sputter deposition system, or other suitable deposition system. The processing chamber houses at least one sputtering target of material that will comprise the absorber material layer. At least one of the sputtering targets is a metal-comprising material and at least one of the sputtering targets is a fluorine-comprising material, which targets can be the same one target. For example, one sputtering target of the system may comprise chromium fluoride used to form a fluorinated chromium-comprising absorber material layer. Ion beams guns disposed within or protruding into the chamber are directed at the sputtering targets. A sputter efflux from the sputtering targets is produced by actuating the ion beam guns and impinging ion beams from the guns onto the sputtering targets (step 256). In an optional embodiment, oxygen gas is supplied to the chamber through an oxygen supply tube before and/or during formation of the sputter efflux to convert the sputter efflux to an oxide efflux (step 254). The sputtered efflux leaves the sputtering target(s) and is deposited as a layer of film (atop of possibly more films) on the substrate (step 258). In another optional embodiment, before and/or during formation of the sputter efflux, the chamber may be heated to facilitate formation of the sputter efflux and deposition of the sputter efflux on the substrate (step 260).

It will be appreciated that method 250 may be used in a variety of manners to produce a fluorine-passivated absorber material layer. For example, the sputtering process may be performed continuously until one uniform fluorine-passivated absorber material layer having a desired thickness is formed on the substrate. In another exemplary embodiment, the fluorine-passivated absorber material layer can be formed of sub-layers, with alternating layers being fluorinated layers. In this regard, a first layer of material from a first sputtering target is deposited on the substrate or on a layer on the substrate, a layer of fluorine-comprising material is deposited on the first layer, and another first layer, or a second layer comprising different material, is deposited thereon. Alternatively, a first layer of material from a first sputtering target is deposited on the substrate or on a layer on the substrate, the layer is subjected to one of the fluorination processes described above, and a second layer of the same or different material as the first layer then is deposited on the fluorinated first layer. The layering process can continue until an absorber material layer of desired thickness and fluorination is formed overlying the substrate.

Referring back to FIG. 2, in an optional exemplary embodiment, after formation of the fluorine-passivated absorber material layer overlying the substrate, an ARC, such as ARC 16 of FIG. 1, is deposited overlying the absorber material layer. The thickness of the ARC depends, at least in part, on the material used to form the ARC and the wavelength of the radiation to be used in a photolithography process. In one embodiment, the ARC comprises chromium oxide ($Cr_2O_3$) having a thickness, for example, in the range of from about 10 nm to about 20 nm. In another embodiment, the ARC is formed of calcium fluoride or magnesium fluoride and has a thickness in the range of from about 15 nm to about 40 nm. In a further embodiment, the ARC may be metal nitroso (e.g., M-O-N) compounds or metal halide (e.g., M-Cl-O-N, M-F-O-N, or M-Cl-F-O-N) compounds where the metal element M for each compound is chromium, cobalt, iron, zinc, molybdenum, niobium, tantalum, titanium, tungsten, aluminum, magnesium, hafnium, silicon, or combinations thereof. Further, the ARC may include a multiple layer combination of any of the mentioned material listed above. The ARC may be deposited using an ion beam sputter deposition process, a plasma sputter deposition process, or the like. In one exemplary embodiment, the ARC may be deposited using the same deposition system used to form the fluorine-passivated absorber material layer. In this regard, because the reticle remains in the same chamber of the deposition system during formation, contamination of the reticle is minimized.

After fabrication, the fluorine-passivated absorber material layer and, if present, the ARC, are patterned to produce a desired image in the absorber material layer (step 58). The fluorine-passivated absorber material layer can be patterned using any conventional photolithography process, such as laser or electron beam lithography. In an alternative exemplary embodiment, while FIG. 2 illustrates that the step of patterning the absorber material layer is performed after the step of fluorinating the absorber material layer, it will be appreciated that, for direct fluorination, photochemical fluorination, or thermal fluorination, the absorber material layer can be patterned first and then subjected to fluorination. In another alternative embodiment, while FIG. 2 illustrates that the step of patterning the absorber material layer is performed after the step of depositing an ARC, it will be appreciated that the absorber material layer can be patterned first, followed by deposition of the ARC thereon. Once fully patterned, the reticle may be used for photolithography of semiconductor wafers or the reticle may be further processed, such as, for example, with the addition of a pellicle or other protective structures or layers.

Figure 8:
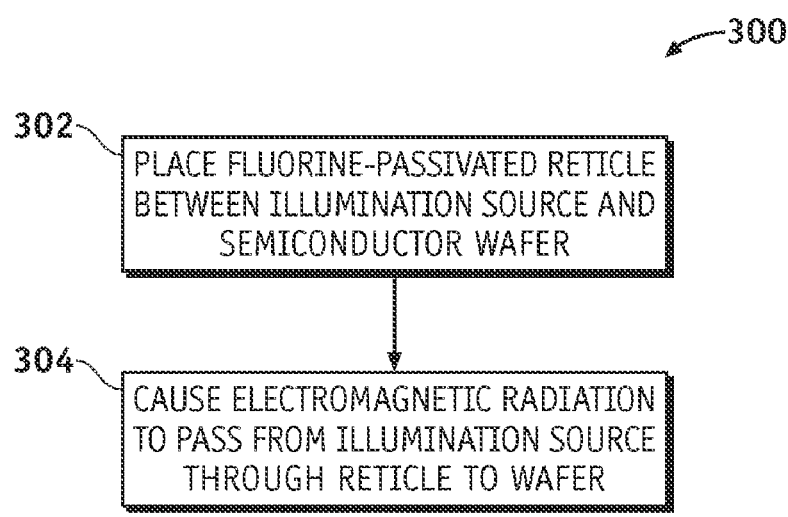
FIG. 8 is a flowchart of a method for using a fluorine-passivated reticle in a photolithography process, in accordance with an exemplary embodiment of the present invention.

After the fluorine-passivated reticle is fabricated, it is placed in a lithography system for use. FIG. 8 illustrates a method 300 for using a fluorine-passivated reticle in a lithography process. The reticle is placed between an illumination system and a target semiconductor wafer (step 302). The reticle typically is positioned with the backside surface of the reticle, that is, the back surface of the substrate, facing the illumination source. The illumination source is activated to cause the illumination source to emit electromagnetic radiation (step 304). The electromagnetic radiation may include, for example, ultraviolet radiation, deep ultraviolet radiation, extreme ultraviolet radiation, and X-rays. The electromagnetic radiation passes through the reticle and projects a pattern of the patterned fluorine-passivated absorber material layer onto the semiconductor wafer.

Accordingly, fluorine-passivated reticles for use in photolithography, methods for fabricating such fluorine-passivated reticles, and methods for using such fluorine-passivated reticles have been provided. Unlike conventional reticles, the fluorine-passivated reticles do not exhibit material migration during exposure to short-wavelength ultraviolet radiation. Thus, the fluorine-passivated reticles may be used for an extended period of time compared to conventional reticles and may be used without requiring process down-time necessary for removal of the migrated material from the reticles. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating a reticle for use in photolithography, the method comprising the steps of:
   providing a substrate; and
   forming a fluorine-passivated absorber material layer overlying the substrate, the fluorine-passivated absorber material layer comprising a patterned fluorine-passivated absorber material having a fluorinated surface, wherein forming the fluorine-passivated absorber material layer comprises the steps of:
      forming an absorber material layer overlying the substrate;
      patterning the absorber material layer; and
      fluorinating the absorber material layer after the step of patterning the absorber material layer.

2. The method of claim 1, further comprising the step of depositing an antireflective coating overlying the fluorine-passivated absorber material layer.

3. The method of claim 1, wherein the step of fluorinating the absorber material layer comprises exposing the absorber material layer to fluorine gas.

4. The method of claim 1, wherein the step of fluorinating the absorber material layer comprises subjecting the absorber material layer to a photochemical fluorination process.

5. The method of claim 4, wherein the step of subjecting the absorber material layer to a photochemical fluorination process comprises the steps of:
   exposing the absorber material layer to a fluorinating agent that decomposes photochemically upon exposure to ultraviolet radiation to form fluorine ions; and
   irradiating the fluorinating agent with ultraviolet radiation.

6. The method of claim 5, wherein the step of exposing the absorber material layer to a fluorinating agent that decomposes photochemically upon exposure to ultraviolet radiation comprises exposing the absorber material layer to a fluorinating agent selected from the group consisting of graphite fluoride, hydrogen fluoride, a fluoro-alkyl halogen, a compound having a hexafluoroacetone moiety, and combinations thereof.

7. The method of claim 1, wherein the step of fluorinating the absorber material layer comprises subjecting the absorber material layer to a thermal fluorination process.

8. The method of claim 7, wherein the step of subjecting the absorber material layer to a thermal fluorination process comprises the steps of:
   exposing the absorber material layer to a fluorinating agent that decomposes upon exposure to heat to form fluorine ions; and
   heating the fluorinating agent.

9. The method of claim 8, wherein the step of exposing the absorber material layer to a fluorinating agent that decomposes upon exposure to heat comprises exposing the absorber material layer to a fluorinating agent selected from the group consisting of graphite fluoride, hydrogen fluoride, a fluoro-alkyl halogen, a compound having a hexafluoroacetone moiety, and combinations thereof.

10. The method of claim 1, wherein the step of fluorinating the absorber material layer comprises subjecting the absorber material layer to an electrochemical fluorination process.

11. The method of claim 10, wherein the step of subjecting comprises the steps of:
    providing a bath comprising a fluorinating agent;
    heating the bath to at least 50° C.;
    configuring the absorber material layer as an anode and immersing the absorber material layer in the bath; and
    passing a current through the bath between the absorber material layer and a cathode.

12. The method of claim 11, wherein the step of providing a bath comprising a fluorinating agent comprises providing the bath with a fluorinating agent selected from the group consisting of an anhydrous hydrogen fluoride solution, a triethylamine-hydrogen fluoride complex, cesium fluoride-ammonium fluoride-hydrogen fluoride complex (CsF-NH4F-4HF), and combinations thereof.

* * * * *